United States Patent
Takikawa (10) Patent No.: US 11,412,606 B2
(45) Date of Patent: Aug. 9, 2022

(54) PLASMA GENERATOR AND INFORMATION PROCESSING METHOD

(71) Applicant: FUJI CORPORATION, Chiryu (JP)

(72) Inventor: Shinji Takikawa, Anjo (JP)

(73) Assignee: FUJI CORPORATION, Chiryu (JP)

( * ) Notice: Subject to any disclaimer, the term of this patent is extended or adjusted under 35 U.S.C. 154(b) by 56 days.

(21) Appl. No.: 16/963,877

(22) PCT Filed: Jan. 23, 2018

(86) PCT No.: PCT/JP2018/001872
§ 371 (c)(1),
(2) Date: Jul. 22, 2020

(87) PCT Pub. No.: WO2019/145990
PCT Pub. Date: Aug. 1, 2019

(65) Prior Publication Data
US 2021/0051791 A1   Feb. 18, 2021

(51) Int. Cl.
*H05H 1/46* (2006.01)
*H01J 37/244* (2006.01)
*H01J 37/32* (2006.01)

(52) U.S. Cl.
CPC ............. *H05H 1/46* (2013.01); *H01J 37/244* (2013.01); *H01J 37/32449* (2013.01); *H01J 37/32559* (2013.01); *H01J 37/32935* (2013.01); *H01J 2237/0206* (2013.01)

(58) Field of Classification Search
None
See application file for complete search history.

(56) References Cited

U.S. PATENT DOCUMENTS

| 6,841,124 | B2 | 1/2005 | Chien et al. |
| 8,961,894 | B2* | 2/2015 | Keener ............... A61L 2/14 |
| | | | 422/305 |
| 9,123,508 | B2* | 9/2015 | Chistyakov ......... H01J 37/3408 |
| 9,408,930 | B2* | 8/2016 | Keener ................ B65B 55/18 |

(Continued)

FOREIGN PATENT DOCUMENTS

| DE | 197 56 445 A1 | 2/1999 |
| DE | 10 2006 023 232 A1 | 11/2007 |

(Continued)

OTHER PUBLICATIONS

International Search Report dated Mar. 6, 2018 in PCT/JP2018/001872 filed Jan. 23, 2018, citing documents AO-AQ therein, 2 pages.

*Primary Examiner* — Srinivas Sathiraju
(74) *Attorney, Agent, or Firm* — Oblon, McClelland, Maier & Neustadt, L.L.P.

(57) ABSTRACT

It is an object of the present invention to provide a plasma generator capable of efficiently identifying the cause of an abnormal stoppage when an abnormal stoppage of the plasma generator occurs. When the controller determines that at least one detected value has become an abnormal value, the controller terminates plasma generation control. Further, in response to starting plasma generation control, the controller causes the storage section to store a history of detected values in association with time. As a result, it is possible to provide a history of detected values stored in the storage section to efficiently identify the cause of the abnormal stoppage.

9 Claims, 5 Drawing Sheets

(56) References Cited

U.S. PATENT DOCUMENTS

| | | | |
|---|---|---|---|
| 9,620,334 B2* | 4/2017 | Lyndaker | H01J 37/32183 |
| 9,635,750 B2* | 4/2017 | Cheung | H01J 37/321 |
| 9,750,833 B2* | 9/2017 | Keener | A61L 2/14 |
| 9,848,484 B2* | 12/2017 | Tabata | H05H 1/24 |
| 10,137,522 B2* | 11/2018 | Winn | B23K 10/00 |
| 10,192,721 B2* | 1/2019 | Kasai | H03F 3/2173 |
| 10,201,069 B2* | 2/2019 | Hayano | H01J 37/32091 |
| 10,212,797 B2* | 2/2019 | Mann | H05H 1/24 |
| 10,368,427 B2* | 7/2019 | Morrisroe | G01J 1/42 |
| 10,601,125 B2* | 3/2020 | Cohen | H01Q 9/005 |
| 10,610,953 B2* | 4/2020 | Chin | B23K 10/00 |
| 10,950,420 B2* | 3/2021 | Jindo | H01J 37/32825 |
| 10,975,470 B2* | 4/2021 | Shugrue | C23C 16/455 |
| 2015/0206717 A1* | 7/2015 | Valcore, Jr. | H01J 37/32935 315/111.21 |
| 2016/0322202 A1* | 11/2016 | Valcore, Jr. | H01J 37/32183 |
| 2016/0322203 A1* | 11/2016 | Bhutta | H05H 1/46 |
| 2017/0001255 A1 | 1/2017 | Winn et al. | |
| 2020/0261997 A1* | 8/2020 | Daniel | G06Q 10/06 |
| 2020/0365371 A1* | 11/2020 | Mori | H01J 37/3222 |
| 2020/0396821 A1* | 12/2020 | Jindo | H05H 1/36 |
| 2021/0051791 A1* | 2/2021 | Takikawa | H05H 1/3494 |

FOREIGN PATENT DOCUMENTS

| | | |
|---|---|---|
| JP | 2003-173973 A | 6/2003 |
| JP | 2004-154562 A | 6/2004 |
| JP | 2004-296612 A | 10/2004 |
| JP | 2014-70244 A | 4/2014 |
| WO | WO 2017/056185 A1 | 4/2017 |
| WO | WO 2018/218021 A1 | 11/2018 |

* cited by examiner

PLASMA GENERATOR AND INFORMATION PROCESSING METHOD

TECHNICAL FIELD

The present application relates to a plasma generator and an information processing method.

BACKGROUND ART

Patent Literature 1 discloses a system having a plasma generator configured to monitor current and voltage applied to plasma in a chamber and control the power applied.

PATENT LITERATURE

Patent Literature 1: JP-A-2004-154562

BRIEF SUMMARY

Technical Problem

In a plasma generator, there are cases in which an abnormal stoppage occurs in the plasma generator due to, for example, an abnormality in the gas flow rate caused by a failure or the like of a gas supply device for supplying gas. In the case of an abnormal stoppage, information on, for example, the progression of the gas flow rate before the abnormal stoppage is useful for identifying the cause of the abnormality occurrence.

It is an object of the present disclosure to provide a plasma generator and an information processing method capable of efficiently identifying the cause of an abnormal stoppage when an abnormal stoppage of the plasma generator occurs.

Solution to Problem

The present specification discloses a plasma generator, configured to generate plasma by a discharge between electrodes, comprising: a detector configured to detect an abnormality; a storage device; and a control device; wherein the control device stores the state of the plasma generator in the storage device in association with time, and executes a storage process for storing the state of the plasma generator in the storage device from a predetermined time period before the detector detects the abnormality, to the time the detector detects the abnormality.

Advantageous Effects

According to the present disclosure, it is possible to provide a plasma generator and an information processing method capable of efficiently identifying the cause of an abnormal stoppage when an abnormal stoppage of the plasma generator occurs.

DESCRIPTION OF EMBODIMENTS

Configuration of Atmospheric Pressure Plasma Generator

Figure 1:
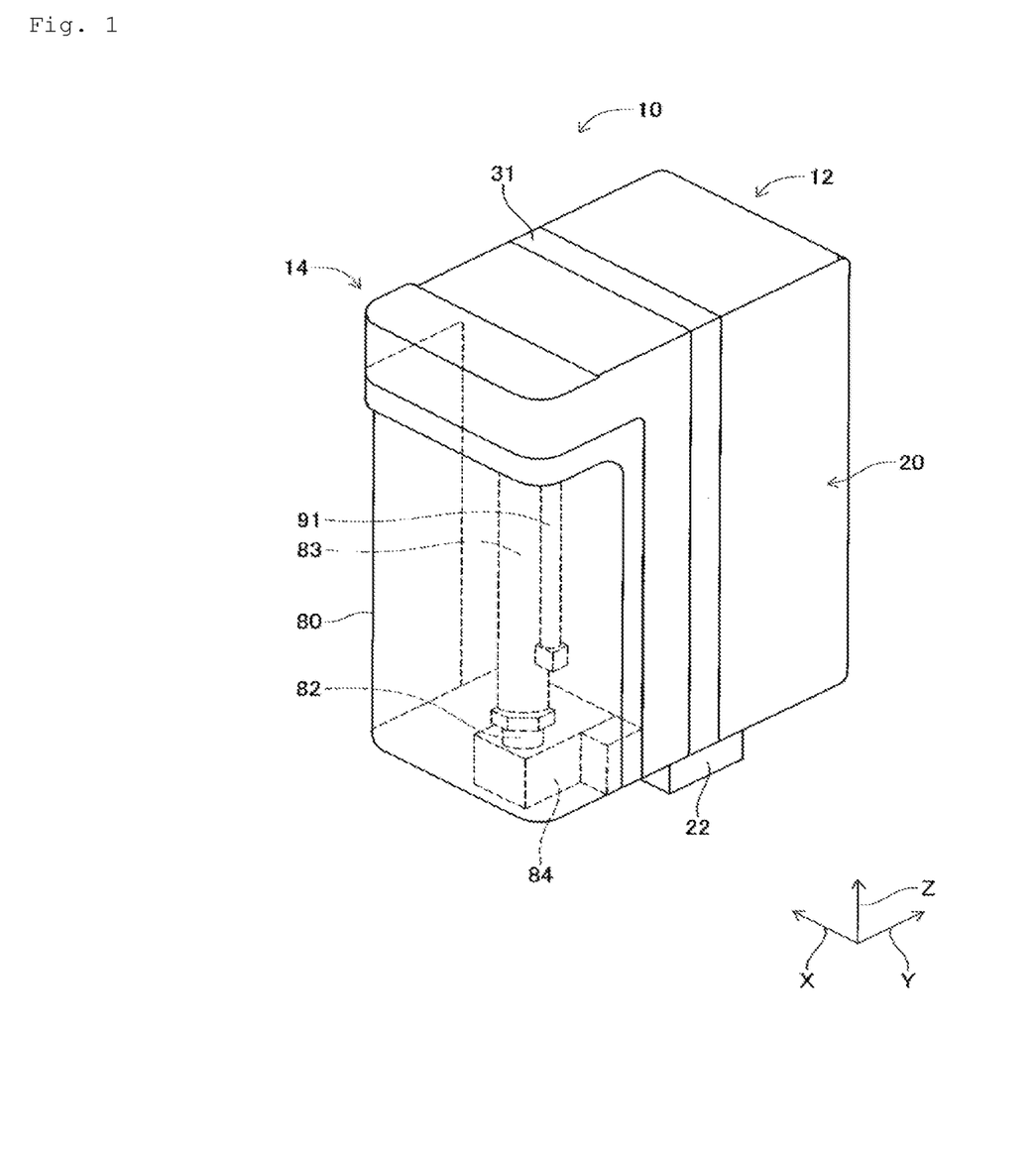
FIG. 1 A perspective view showing an atmospheric pressure plasma generator.

Atmospheric pressure plasma generator 10 is a device for generating plasma under atmospheric pressure. As shown in FIG. 1, atmospheric pressure plasma generator 10 includes plasma gas emission device 12, heated gas emission device 14, and control device (see FIG. 4) 16. In the following description, the width direction of atmospheric pressure plasma generator 10 is referred to as the X-direction, the depth direction of atmospheric pressure plasma generator 10 is referred to as the Y-direction, the direction perpendicular to the X-direction and the Y-direction, that is, the up-down direction, is referred to as the Z-direction.

Figure 3:
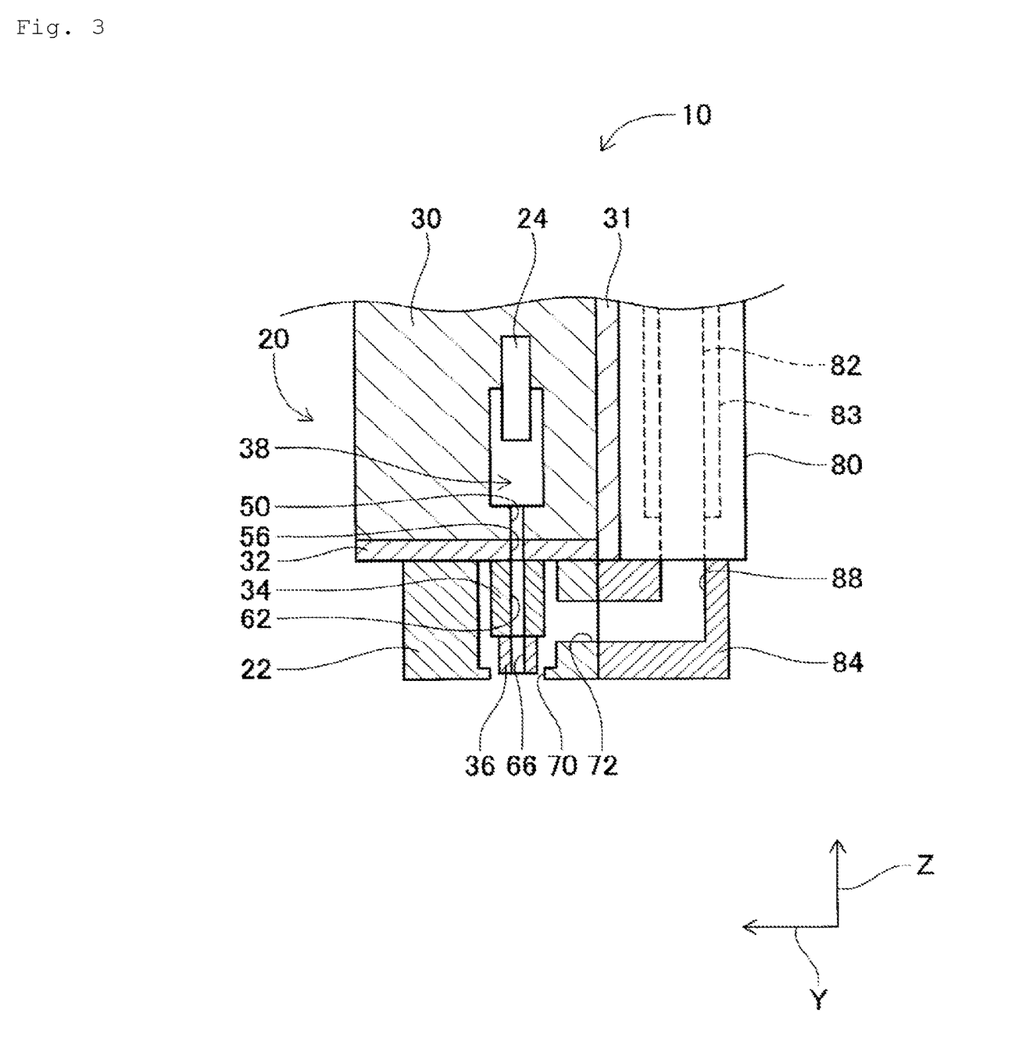
FIG. 3 A cross-sectional view showing a main portion of the atmospheric pressure plasma generator.

Plasma gas emission device 12 is composed of housing 20, cover 22, and a pair of electrodes 24, 26 (FIG. 3). As shown in FIG. 3, housing 20 includes main housing 30, heat sink 31, ground plate 32, lower housing 34, and nozzle block 36. Main housing 30 has a general block shape, and reaction chamber 38 is formed inside main housing 30. Further, multiple first gas flow paths (only one first gas flow path is shown in FIG. 3) 50, extending in the up-down direction, are formed in main housing 30, and multiple first gas flow paths 50 are arranged at predetermined intervals in the X-direction. The upper end of each of first gas flow paths 50 is opened to reaction chamber 38, and the lower end thereof is opened to the bottom face of main housing 30.

Heat sink 31 is disposed on one side, in the Y-direction, of main housing 30. Heat sink 31 has multiple fins (not shown) and dissipates heat from main housing 30. Ground plate 32 functions as a lightning rod and is fixed to the lower face of main housing 30. Multiple through-holes 56 corresponding to multiple first gas flow paths 50 penetrate ground plate 32 in the up-down direction, each through-hole 56 being connected to a corresponding first gas flow path 50.

Lower housing 34 has a block shape and is fixed to the lower face of ground plate 32. Multiple second gas flow paths 62 corresponding to multiple through-holes 56 penetrate lower housing 34 in the up-down direction. The upper end of each second gas flow path 62 is connected to a corresponding through-hole 56, and the lower end is open to the bottom face of lower housing 34.

Figure 2:
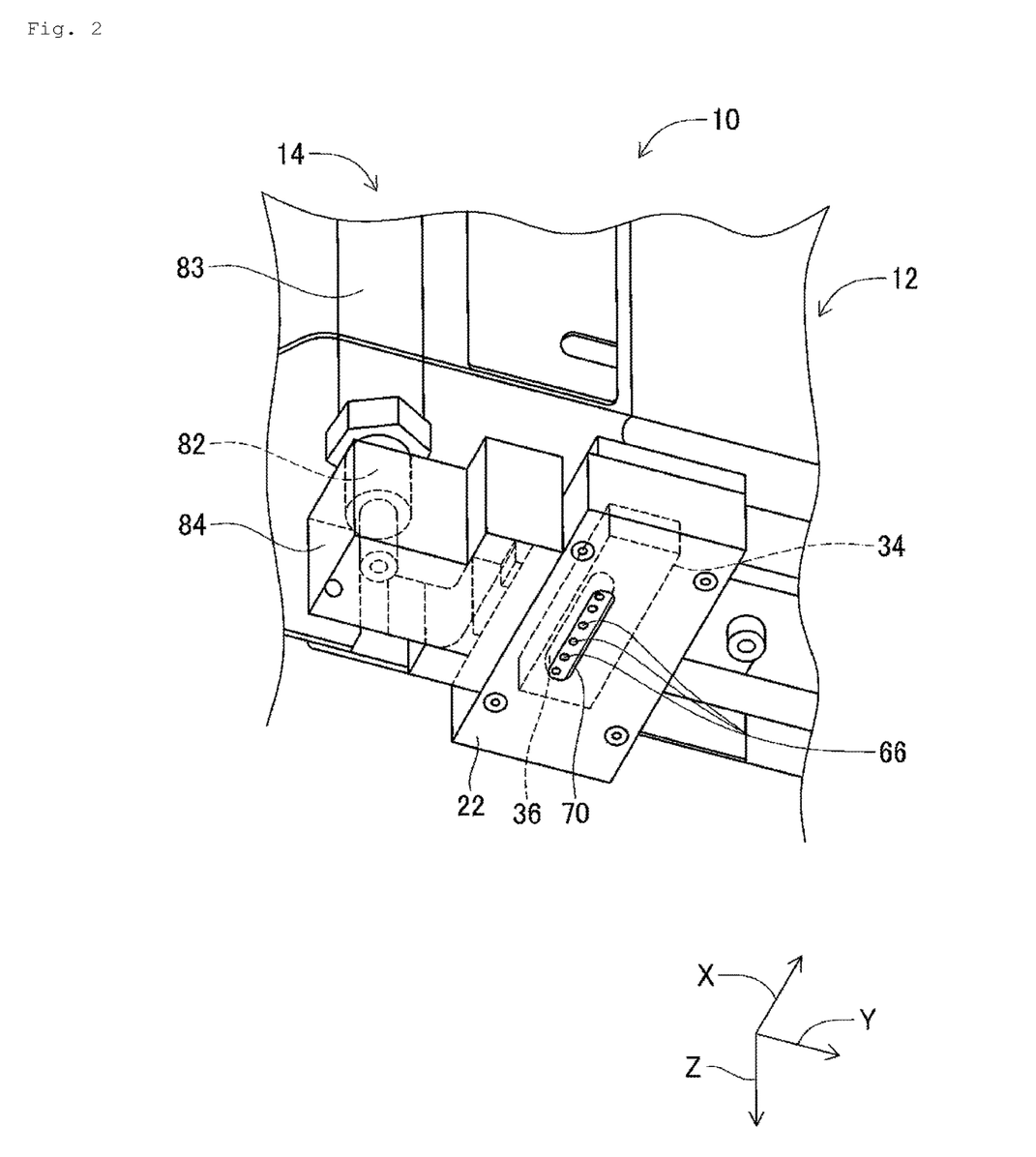
FIG. 2 A perspective view showing the bottom of the atmospheric pressure plasma generator.

As shown in FIG. 2, nozzle block 36 is fixed to the lower face of lower housing 34, multiple third gas flow paths 66, corresponding to multiple second gas flow paths 62 of lower housing 34, are formed so as to extend in the up-down direction. The upper end of each third gas flow path 66 is connected to a corresponding second gas flow path 62, and the lower end is open to the bottom face of nozzle block 36.

Returning to FIG. 3, cover 22 has a general square shape and is disposed on the lower face of ground plate 32 so as to cover lower housing 34 and nozzle block 36. Through-hole 70 is formed in the lower face of cover 22. Through-hole 70 is larger than the lower face of nozzle block 36, and the lower face of nozzle block 36 is located inside through-hole 70. Further, through-hole 72 penetrates the side face of cover 22 on the heated gas emission device 14 side in the Y-direction.

The pair of electrodes 24, 26 are disposed so as to face each other inside reaction chamber 38 of main housing 30. Process gas supply device (see FIG. 4) 74 is connected to reaction chamber 38. Process gas supply device 74 is a device for supplying at least one of an inert gas such as nitrogen and a reactive gas such as oxygen as a process gas. With this, process gas is supplied to reaction chamber 38. Note that the process gas may be dry air.

Heated gas emission device 14 also includes protective cover 80, gas pipe 82, heater 83, and connecting block 84. Protective cover 80 is disposed to cover heat sink 31 of plasma gas emission device 12. Gas pipe 82 is disposed in the interior of protective cover 80 so as to extend in the up-down direction, and heated gas supply device (see FIG. 4) 86 is connected to gas pipe 82. Heated gas supply device 86 is a device for supplying a reactive gas such as oxygen or an inert gas such as nitrogen. Further, a generally cylindrical heater 83 is disposed with respect to gas pipe 82, and gas pipe 82 is heated by heater 83. As a result, the gas supplied from heated gas supply device 86 to gas pipe 82 is heated. Further, thermocouple (FIG. 4) 92 covered with a generally cylindrical thermocouple cover 91 is disposed on heater 83.

Connecting block 84 is connected to the lower end of gas pipe 82 and is fixed to the side face of the heated gas emission device 14 side of cover 22 in the Y-direction. Connecting block 84 has communication path 88 which is bent in a general L-shape, with one end of communication path 88 open to the top face of connecting block 84 and the other end of communication path 88 open, in the Y-direction, to the side face on the plasma gas emission device 12 side. One end of communication path 88 communicates with gas pipe 82 while the other end of communication path 88 communicates with through-hole 72 of cover 22.

Figure 4:
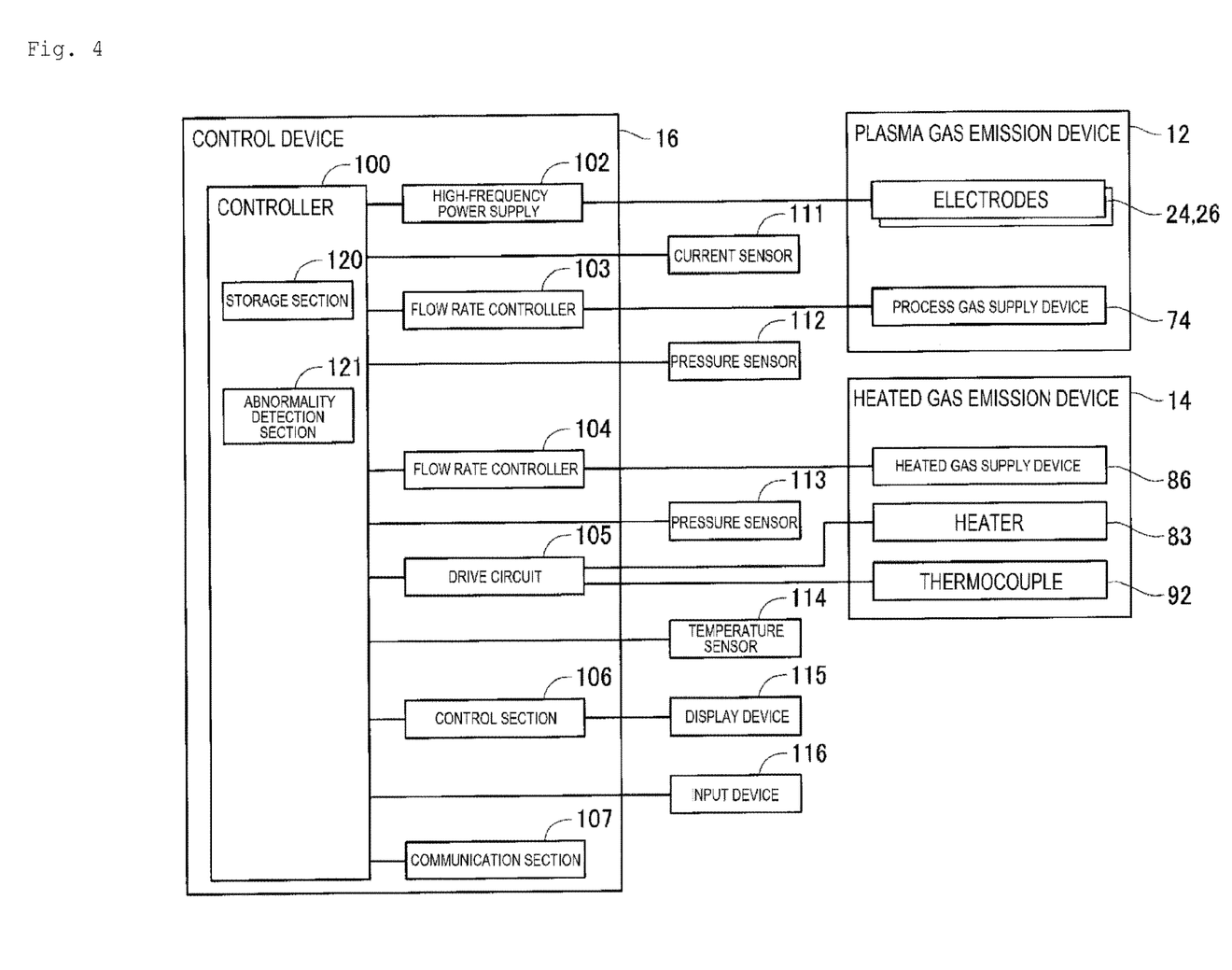
FIG. 4 A block diagram showing a control system of the atmospheric pressure plasma generator.

As shown in FIG. 4, control device 16 includes controller 100, high-frequency power supply 102, drive circuit 105, flow rate controllers 103, 104, control circuit 106, communication section 107, and the like. Controller 100 is a computer or the like having a CPU, ROM, RAM, and the like, which are not shown in the figure. Controller 100 controls plasma gas emission device 12 and heated gas emission device 14 by controlling high-frequency power supply 102, drive circuit 105, and flow rate controllers 103, 104. Further, controller 100 is connected to display device 115 via control circuit 106. As a result, an image is displayed on display device 115 in accordance with instructions from controller 100. Further, controller 100 is connected to input device 116. Input device 116 is configured with operation buttons or the like and outputs operation information by operation of the operation buttons. In this way, operation information by operation of the operation buttons is inputted to controller 100. Communication section 107 performs communication with a communication device connected to a network (not shown). The form of communication is not particularly limited and can be, for example, LAN, serial communication, or the like. Controller 100 includes storage section 120 and abnormality detection section 121 as functional sections. The state of atmospheric pressure plasma generator 10 is stored in storage section 120 in a storage process to be described later. Abnormality detection section 121 detects an abnormality by determining whether an abnormality has occurred based on output values from current sensor 111, pressure sensor 112, 113, thermocouple 92, and temperature sensor 114, which are described later.

Figure 5:
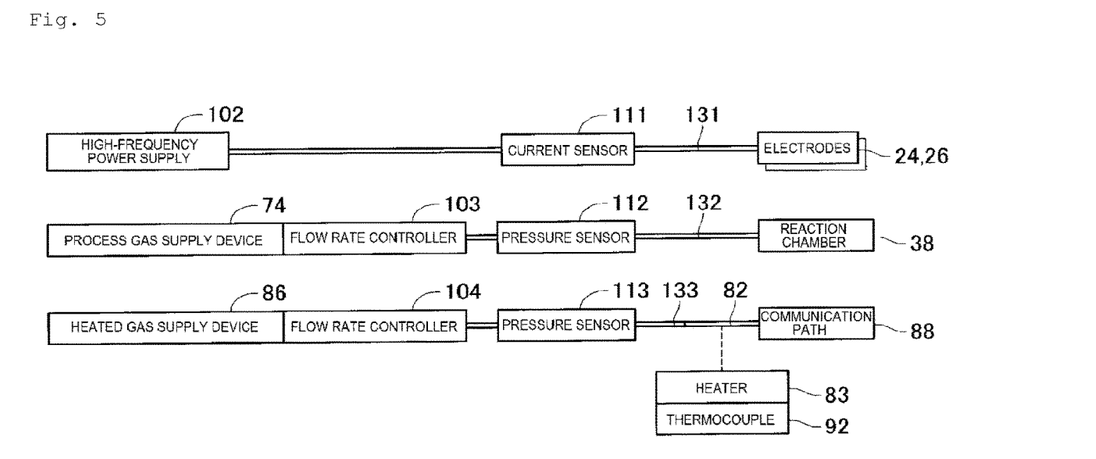
FIG. 5 A block diagram showing the physical connections of a high-frequency power supply, a process gas supply device, and a heated gas supply device to electrodes and a reaction chamber.

As shown in FIG. 5, high-frequency power supply 102 generates high-frequency AC power to supply power from a commercial power source to electrodes 24, 26 and supplies the generated AC power to electrodes 24, 26. Current sensor 111 detects the current flowing through feed line 131, feed line 131 being for supplying power from high-frequency power supply 102 to electrodes 24, 26. Specifically, current sensor 111 includes, for example, a current transformer, performs an analog to digital conversion on the detected voltage corresponding to the current in feed line 131 detected by the current transformer and outputs the digital value to controller 100. Hereinafter, a digital value corresponding to the current value may be described simply as the current value.

Flow rate controller 103 is, for example, a mass flow controller. Flow rate controller 103 controls the flow rate of process gas supplied from process gas supply device 74 to reaction chamber 38. Further, flow rate controller 103 outputs to controller 100 the flow rate value of the process gas supplied. Pressure sensor 112 is attached to pipe 132, which is for process gas supplied from process gas supply device 74 to reaction chamber 38, and detects the gas pressure of the process gas and outputs the detected gas pressure value to controller 100.

Flow rate controller 104, similar to flow rate controller 103, controls the flow rate of gas supplied from heated gas supply device 86 to gas pipe 82. Further, flow rate controller 104 outputs to controller 100 the flow rate value of the gas supplied to controller 100. Pressure sensor 113 detects the gas pressure of the gas supplied to pipe 133, which is for gas supplied from heated gas supply device 86 to communication path 88 through gas pipe 82, and outputs the detected gas pressure value to controller 100.

Thermocouple 92, attached to the vicinity of heater 83, is electrically connected to drive circuit 105. Drive circuit 105 controls heater 83 based on the output value of thermocouple 92 to achieve a target temperature set by controller 100. Further, drive circuit 105 outputs a temperature corresponding to the output value of thermocouple 92 to controller 100. Temperature sensor 114 having, for example, a thermocouple, detects the temperature of the plasma gas (described later) and outputs the detected temperature to controller 100.

Plasma Treatment with the Atmospheric Pressure Plasma Generator

In atmospheric pressure plasma generator 10, in plasma gas emission device 12, the process gas (an example of the reaction gas) is converted into plasma in reaction chamber 38 with the above-described configuration, and the plasma gas (an example of the plasma gas) is emitted from the lower end of third gas flow path 66 of nozzle block 36. In addition, gas (an example of heated gas) heated by heated gas emission device 14 is supplied to the inside of cover 22. The plasma gas is then emitted from through-hole 70 of cover 22 together with the heated gas, and the treatment target is subjected to plasma treatment.

Specifically, in plasma gas emission device 12, the process gas is supplied to reaction chamber 38 by process gas supply device 74. At this time, in reaction chamber 38, electric power is supplied to the pair of electrodes 24, 26, and current flows between the pair of electrodes 24, 26. Thus, a discharge occurs between the pair of electrodes 24, 26, and the process gas is converted into plasma by the discharge. The plasma generated in reaction chamber 38 flows downward in first gas flow path 50 and flows into second gas flow path 62 via through-hole 56. The plasma gas then flows down second gas flow path 62 and third gas flow path 66. In this way, the plasma gas is emitted from the lower end of third gas flow path 66.

Further, in heated gas emission device 14, gas is supplied to gas pipe 82 by heated gas supply device 86, and gas pipe 82 is heated by heater 83. As a result, gas supplied to gas pipe 82 is heated to the 600° C. to 800° C. range. The heated gas flows inside cover 22 from through-hole 72 of cover 22 via communication path 88 of connecting block 84. The heated gas flowing into cover 22 is emitted from through-hole 70 of cover 22. In this situation, the plasma gas emitted from the lower end of third gas flow path 66 of nozzle block 36 is protected by the heated gas. This makes it possible to properly perform the plasma treatment.

Specifically, at the time of plasma treatment, the treatment target is placed at a position separated from the emission port, which emits the plasma gas, by a predetermined distance, and the plasma gas is emitted from the emission port to the treatment target. That is, during plasma treatment, the plasma gas is emitted into the air, and the plasma gas emitted into the air is irradiated onto the treatment target.

Upon receiving an instruction to start plasma generation via input device 116, controller 100 starts plasma generation control. In plasma generation control, controller 100 causes high-frequency power supply 102 to start the control of supplying a predetermined power to electrodes 24, 26 and causes controllers 103, 104 to start supplying process gas and to-be-heated gas at predetermined gas flow rates and gas pressures to each of flow rate controllers 103, 104. Further, controller 100 causes drive circuit 105 to control heater 83 so that heater 83 reaches a predetermined temperature.

Further, when starting the plasma generation control, controller 100 starts a storage process of storing in storage section 120, at every predetermined time interval, the current value outputted from current sensor 111, the flow rate values outputted from flow rate controllers 103, 104, the gas pressure values outputted from pressure sensors 112, 113, the temperature outputted from drive circuit 105 and temperature sensor 114 in association with the time. In the following description, the current value, the flow rate value, the gas pressure value, and the temperature outputted from drive circuit 105 and sensor 114 stored in association with the time are referred to as a history. Further, in the following description, the current value, the flow rate value, the gas pressure value, and the temperature are collectively referred to as detected values. In storage section 120, a region in which a history is stored is determined in advance. Accordingly, in the storage process, when a history is stored in a predetermined region of storage section 120 and no empty region in which a new history can be stored is available, controller 100 overwrites the oldest historical data within the history stored in storage section 120. In this way, a history for a prior predetermined period can be stored in storage section 120. The predetermined period is, for example, about several minutes.

Figure 6:
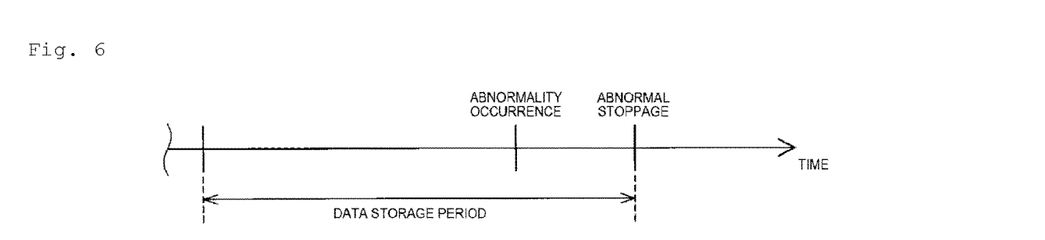
FIG. 6 A diagram showing a data storage period.

When at least one of the detected values becomes an abnormal value and abnormality detection section 121 determines that an abnormality has occurred, controller 100 stops supplying power to electrodes 24, 26, stops supplying process gas and heated gas, and terminates plasma generation control. As a result, plasma generation of atmospheric pressure plasma generator 10 is stopped. Controller 100 then ends the storage process. As a result, as shown in FIG. 6, storage section 120 reaches a state in which the history is stored for a predetermined period before the abnormal stoppage. The abnormality occurrence in FIG. 6 indicates a point in time when controller 100 determines that at least one of the detection values has become an abnormal value. Further, the abnormal stoppage in FIG. 6 indicates the point in time described above at which controller 100 has determined a value has become abnormal and has stopped the power supply to electrodes 24, 26 and stopped supplying process gas and heated gas.

Upon terminating plasma generation control as a consequence of the abnormal stoppage, controller 100 causes display device 115 to display history on display device 115. The display format is, for example, a graph in which the detection value is plotted with respect to time. As a result, the operator can investigate the cause of the abnormal stoppage. For instance, some exemplified cases will be described next, in which it is determined that the temperature, being detected by thermocouple 92 disposed with heater 83, outputted from drive circuit 105 has become an abnormal value. There is a case in which the temperature rise is slower than usual, and even after a predetermined period of time lapses, the temperature not is larger than a lower limit value for abnormality determination, of which cause is that the temperature did not rise enough. Further, there is another case such that although the temperature detected by thermocouple 92 is greater than the lower limit value for abnormality determination, that is, the temperature is higher than the predetermined temperature, thereafter the temperature decreases suddenly due to, for example, disconnection of thermocouple 92, disconnection of the power line, or failure or the like of heater 83. In this way, since the tendency of the change in the detection value differs depending on the cause, the history becomes useful in investigating the cause of the abnormality.

Here, other cases beside the case described above in which abnormality detection section 121 determines that an abnormality has occurred will be described. Current flows between electrodes 24, 26 when a discharge is formed. Therefore, based on the current value from current sensor 111, abnormality detection section 121 determines that an abnormality has occurred when, within a predetermined time period, the number of times the current was insufficient due to lack of current has exceeded a predetermined number of times. Further, if the gas flow rate value becomes an abnormal value, the pipe may be misaligned or clogged, or the like. Further, when the gas pressure becomes abnormal, the pipe may be misaligned, the discharge may be unstable, or the like.

Further, if the gas pressure is increased, in correlation, the number of times the current is insufficient increases, the temperature value from heater 83 increases, or there is a trend toward higher gas flow rates. In the case of the increasing gas flow rates, in correlation, the number of times the current is insufficient tends to increase. Further, when the temperature of heater 83 decreases, the discharge capacity is affected. Further, wear of electrodes 24, 26 and a decrease in voltage supplied to electrodes 24, 26 become factors that increase the number of times the current is insufficient. With the history, it is possible to easily determine whether there is an abnormality in high-frequency power supply 102.

Here, atmospheric pressure plasma generator 10 is an example of a plasma generator, electrodes 24, 26 are examples of an electrode and a pair of electrodes, current sensor 111 is an example of a power detector, flow rate controllers 103, 104 and pressure sensors 112, 113 are examples of gas detectors. Controller 100 is an example of a control device; abnormality detection section 121, current sensor 111, flow rate controllers 103, 104, and pressure sensors 112, 113 are examples of detectors; and storage section 120 is an example of a storage device. Display device 115 is an example of a display section. Further, the current value outputted from current sensor 111 is an example of the state and the power supply quantity of the plasma generator. The flow rate value outputted from flow rate controllers 103, 104, the gas pressure value outputted from pressure sensors 112, 113, the temperature of thermocouple 92 outputted from drive circuit 105 and the temperature outputted from temperature sensor 114 are examples of the state of the plasma generator and the gas state. The flow rate value outputted from flow rate controllers 103, 104, the gas pressure value outputted from pressure sensors 112, 113, the temperature of thermocouple 92 outputted from drive circuit 105 and the temperature outputted from temperature sensor 114 are examples of the gas flow rate, the gas pressure, and the gas temperature, respectively. Housing 20 is an example of a housing, heater 83 is an example of a heater, high-frequency power supply 102 is an example of a high-frequency power supply. Further, cover 22, lower housing 34, nozzle block 36, and the part that forms connecting block 84 are examples of a connecting block. Further, first gas flow path 50 is an example of an opening, second gas flow path 62 and third gas flow path 66 are examples of a communication path, pipe 132 is an example of a reaction gas supply path, and pipe 133 is an example of a heated gas supply path. Pressure sensor 112 is an example of a first pressure sensor, flow rate controller 103 is an example of a first flow rate sensor, pressure sensor 113 is an example of a second pressure sensor, flow rate controller 104 is an example of a second flow sensor, and thermocouple 92 is an example of a temperature sensor.

With the embodiment described above, the following effects are obtained.

When abnormality detection section 121 determines at least one of the detected values has become an abnormal value, controller 100 stops supplying power to electrodes 24, 26, stops supplying the process gas and the heated gas, and terminates the plasma generation control. Further, controller 100 starts the storage process in accordance with starting the plasma generation control and ends the storage process in accordance with ending the plasma generation control. As a result, it is possible to provide a history of detection values stored in storage section 120 and provide atmospheric pressure plasma generator 10 which efficiently identifies the cause of an abnormal stoppage.

Further, in the storage process, when a history is stored in a predetermined region of storage section 120 and no empty region, for a new history being stored, is available, controller 100 overwrites the oldest historical data within the history stored in storage section 120 by sequentially updating the history while retaining data by turning back a predetermined time period. As a result, it is possible to efficiently store the history before the abnormal stoppage for a predetermined amount of time in the limited storage area of storage section 120.

Further, controller 100 starts the storage process in accordance with starting the plasma generation control and ends the storage process in accordance with ending the plasma generation control. In other words, controller 100 does not store data for the detector during the period in which the plasma generation control is not being performed. The detection values of the period during which plasma generation control is not performed is not useful for investigating the cause of an abnormal stoppage. Therefore, power is saved as a result of restricting the period in which the storage process is performed to within the period in which power of atmospheric pressure plasma generator 10 is turned on.

Further, atmospheric pressure plasma generator 10 includes display device 115 for displaying the detected values stored in storage section 120. As a result, an operator can efficiently investigate the cause of an abnormal stoppage by looking at the history of detected values displayed on display device 115.

It is needless to say that the present disclosure is not limited to the above-described embodiments, and various modifications and changes can be made within a range not departing from the spirit of the present disclosure.

For example, in the above description, during the storage process, the current value outputted from current sensor 111, the flow rate value outputted from flow rate controllers 103, 104, the gas pressure value outputted from pressure sensors 112, 113, the temperature outputted from drive circuit 105, and the temperature outputted from temperature sensor 114 are all described as being stored, but the present disclosure is not limited thereto. An embodiment may be configured to store any one of the current value outputted from current sensor 111, the flow rate value outputted from flow rate controllers 103, 104, the gas pressure value outputted from pressure sensors 112, 113, the temperature outputted from drive circuit 105, and the temperature outputted from temperature sensor 114. Furthermore, an embodiment may be configured to store at least one of the flow rate value outputted from flow controllers 103, 104, the gas pressure value outputted from pressure sensors 112, 113, the temperature outputted from drive circuit 105, and the temperature outputted from temperature sensor 114.

Further, in the above description, when at least one of the detected values is determined to have become an abnormal value, controller 100 stops supplying power to electrodes 24, 26, stops supplying the process gas and the heated gas, terminates the plasma generation control, and then terminates the storage process, but the disclosure is not limited thereto. Controller 100 may be configured to terminate the storage process in response to determining that at least one of the detected values has become an abnormal value.

Further, in the above description, controller 100 displays the history on display device 115 when the plasma generation control is completed due to an abnormal stoppage, but the present disclosure is not limited to this. During the period in which atmospheric pressure plasma generator 10 is activated, controller 100 may display a menu screen including an operation button for displaying history on display device 115, and may display the history when the operator selects the operation button for displaying history via input device 116. Further, the history data stored in storage section 120 may be transmitted to a network-connected communication device through communication section 107. Thus, a technician who is not in the vicinity of atmospheric pressure plasma generator 10 can investigate the cause of an abnormality by looking at the history through a communication device at the transmission destination.

In the above description, abnormality detection section 121 was described as an example of a detector for detecting an abnormality, but the present disclosure is not limited thereto. For example, apart from controller 100, atmospheric pressure plasma generator 10 may be configured to include a detector for outputting a signal to controller 100 when the output value of pressure sensor 112 exceeds a range of abnormality detection set in advance.

REFERENCE SIGNS LIST

10 Atmospheric pressure plasma generator, 24, 26 Electrodes, 100 Controller, 111 Current sensors, 103, 104 Flow rate controllers, 105 Drive circuit, 112, 113 Pressure sensors, 114 Temperature sensor, 115 Display device, 120 Storage section

The invention claimed is:
1. A plasma generator, configured to generate plasma by a discharge between electrodes, comprising:

a detector configured to detect an abnormality;
a storage device; and
a control device,
wherein the control device stores the state of the plasma generator in the storage device in association with time, and executes a storage process for storing the state of the plasma generator in the storage device from a predetermined time before the detector detects the abnormality, to the time the detector detects the abnormality, and
wherein the control device executes an abnormal stoppage of the plasma generator when the detector detects the abnormality and stores the state of the plasma generator from a time at which the abnormality is detected, to a time at which the abnormal stoppage is executed and then terminates the storing of the state of the plasma generator.

2. The plasma generator of claim 1, the plasma generator further comprising:
a power detector configured to detect the quantity of power supplied to the electrodes; and
a gas detector configured to detect the state of a gas supplied to the electrodes;
wherein the detector detects an abnormality by at least one of the power detector and the gas detector.

3. The plasma generator of claim 2, wherein the power supply quantity is a current value, and the state of the gas is any one of gas pressure, gas flow rate, and gas temperature.

4. The plasma generator of claim 2, further comprising a display section configured to display the state of the plasma generator stored in the storage device,
wherein the power supply quantity is a current value, and the state of the gas is any one of gas pressure, gas flow rate, and gas temperature, and
wherein the controller controls the display to display one or more of the current value, the gas pressure, gas flow rate and gas temperature, in association with the time during the storage process.

5. The plasma generator of claim 1, wherein the control device, during a period of the storage process in which plasma generation control is being performed, sequentially updates and stores the state of the plasma generator in the storage device while retaining data for a predetermined time period by turning back a predetermined time period.

6. The plasma generator of claim 1, wherein the control device interrupts the storage process during a period in which the control device is not controlling plasma generation.

7. The plasma generator of claim 1, further comprising a display section configured to display the state of the plasma generator stored in the storage device.

8. A plasma generator, configured to generate plasma by a discharge between a pair of electrodes, comprising:
the pair of electrodes;
a housing covering the pair of electrodes;
multiple openings provided in the housing;
a reaction gas supply path configured to supply a reaction gas to the pair of electrodes;
a connecting block, comprising multiple communication paths communicating with the multiple openings and a heated gas supply path configured to supply a heated gas, in which the close proximity of the outlets of the multiple communication paths with the outlet of the heated gas supply path enables the heated gas to protect the plasma gas formed by a discharge between the pair of electrodes, the plasma gas having passed through the multiple outlets and multiple communication paths;
a heater disposed in the heated gas supply path;
a temperature sensor disposed in the heater;
a first pressure sensor disposed in the reaction gas supply path;
a first flow rate sensor configured to measure the flow rate of the reaction gas supplied to the reaction gas supply path;
a second pressure sensor disposed in the heated gas supply path;
a second flow rate sensor configured to measure the flow rate of the heated gas supplied to he heated gas supply path;
a high-frequency power supply configured to supply power to the pair of electrodes;
a current sensor configured to detect a current value supplied from the high-frequency power supply to the pair of electrodes;
a detector configured to detect an abnormality in any one of the temperature sensor, the first pressure sensor, the first flow rate sensor, the second pressure sensor, the second flow rate sensor, and the current sensor;
a storage device; and
a control device;
wherein
the control device executes a storage process for storing in the storage device the state of the plasma generator in association with time, and storing in the storage device the state of the plasma generator from a predetermined time before the detector detects the abnormality to the time the detector detects the abnormality, and
wherein the control device executes an abnormal stoppage of the plasma generator when the detector detects the abnormality and stores the state of the plasma generator from a time at which the abnormality is detected, to a time at which the abnormal stoppage is executed and then terminates the storing of the state of the plasma generator.

9. An information processing method in a plasma generator comprising a detector, a control device and a storage device configured to detect an abnormality; wherein the plasma generator generates plasma through a discharge between electrodes,
wherein the information processing method comprises: a storage step of storing in the storage device the state of the plasma generator in association with time, and storing in the storage device the state of the plasma generator in the storage device from a predetermined time before the detector detects the abnormality to the time the detector detects the abnormality, and
wherein the control device executes an abnormal stoppage of the plasma generator when the detector detects the abnormality and stores the state of the plasma generator from a time at which the abnormality is detected, to a time at which the abnormal stoppage is executed and then terminates the storing of the state of the plasma generator.

* * * * *